United States Patent
Dunne et al.

(10) Patent No.: US 7,964,432 B2
(45) Date of Patent: *Jun. 21, 2011

(54) METHOD OF MANUFACTURING LENSES, IN PARTICULAR FOR AN INTEGRATED IMAGER

(75) Inventors: Brendan Dunne, Gardanne (FR); Olivier Gagliano, Marseilles (FR); Robert Ronchi, Roquebrune sur Argens (FR); Roberto Mionetto, Tourves (FR)

(73) Assignee: STMicroelectronics Rousset SAS, Rousset (FR)

( * ) Notice: Subject to any disclaimer, the term of this patent is extended or adjusted under 35 U.S.C. 154(b) by 893 days.

This patent is subject to a terminal disclaimer.

(21) Appl. No.: 11/764,635

(22) Filed: Jun. 18, 2007

(65) Prior Publication Data

US 2007/0291156 A1 Dec. 20, 2007

(30) Foreign Application Priority Data

Jun. 19, 2006 (FR) ...................................... 06 05476

(51) Int. Cl.
H04N 5/225 (2006.01)
(52) U.S. Cl. ................ 438/69; 438/65; 438/66; 438/67; 438/68; 438/48

(58) Field of Classification Search .................. 257/290, 257/291, 431, 432, 433, 434, 444; 438/48, 438/60, 68, 69, 73, 74, 75, 116, 144, 199, 438/22, 23, 26, 27, 28, 29, 65, 66, 67, 57, 438/64

See application file for complete search history.

(56) References Cited

U.S. PATENT DOCUMENTS

| 6,867,420 | B2 * | 3/2005 | Mathies et al. | 250/458.1 |
| 7,580,204 | B2 * | 8/2009 | Mionetto | 359/742 |
| 2003/0108821 | A1 | 6/2003 | Mei et al. | 430/321 |
| 2005/0045927 | A1 | 3/2005 | Li | 257/294 |
| 2005/0141107 | A1 * | 6/2005 | Vigier-Blanc et al. | 359/819 |
| 2006/0213804 | A1 * | 9/2006 | Yu et al. | 206/710 |

FOREIGN PATENT DOCUMENTS

| FR | 2 861 217 | 4/2005 |
| WO | 03/019617 | 3/2003 |
| WO | 2005/053940 | 6/2005 |

* cited by examiner

Primary Examiner — David Vu
Assistant Examiner — Suberr Chi
(74) Attorney, Agent, or Firm — Lisa K. Jorgenson; Robert Iannucci; Seed IP Law Group PLLC

(57) ABSTRACT

A method for manufacturing a micro-module for capturing images having an imager and at least one lens, includes manufacturing at least one imager on a first plate of a semiconductor material, producing at least one optical zone to form a lens in at least one second plate of a transparent material, and of assembling the first and second plates so that the imager can receive light through the optical zone.

25 Claims, 4 Drawing Sheets

METHOD OF MANUFACTURING LENSES, IN PARTICULAR FOR AN INTEGRATED IMAGER

TECHNICAL FIELD

The present disclosure generally relates to the manufacturing of optical lenses for integrated imagers and particularly but not exclusively for CMOS imagers.

BACKGROUND INFORMATION

Imagers produced according to the CMOS ("Complementary Metal Oxide Semiconductor") technology are currently the subject of an increasing number of applications due to their low cost price in comparison with CCD (Charge Coupled Device) imagers. Such CMOS imagers were initially used to produce low resolution image sensors of mediocre quality (for example web cameras). Today, after major investment in research and development, CMOS imagers can compete with CCD imagers.

FIG. 1 represents an example of a module for capturing images and/or video using a CMOS imager, intended for example to be mounted into a portable device such as a mobile telephone, a camera or a video camera. The module 1 comprises a frame 2, an optical set or lens-holder block 3, an objective based on lenses 4 mounted in the block 3 with a diaphragm 5, an infrared filter 6 and a base 7. A CMOS imager 11 having the shape of a semiconductor chip is disposed on the base 7 so as to receive the light passing through the lenses 4, the diaphragm 5 and the infrared filter 6.

The CMOS imager 11 comprises a plurality of photosites each forming a pixel (not visible in FIG. 1). Each pixel comprises a photodiode and a control and interconnection circuit of the photodiode. The pixels are arranged as an array and a mosaic of red, green and blue filters is distributed over the pixel array, generally according to the Bayer architecture (the cells of a line being alternately red and green, or alternately green and blue). Each pixel is thus covered with a determined, red, green or blue, primary color filter and provides a piece of luminance information about the primary color allocated to it, forming a piece of pixel information.

FIG. 2 is a schematic cross-section of the CMOS imager 11 in a region corresponding to three pixels PIX1, PIX2, PIX3. Going from bottom to top, layers 11a, 11b, 11c, 11d, 11e and microlenses L0 (L0-1, L0-2, L0-3) can be distinguished. The layer 11a is the semiconductor substrate in which the imager is implanted. This layer 11a thus represents the active part of the imager and comprises photodiodes and their associated control and interconnection circuits (not detailed). The layer 11b is formed by a dielectric material that entirely covers the substrate 11a. The layer 11c is a passivating layer deposited on the imager at the end of the CMOS manufacturing process. The layer 11d is formed by colored resins and comprises red, green or blue areas 11-1, 11-2, 11-3 forming the above-mentioned primary color filters, with one color filter per pixel. The layer 11e is an intermediate layer of resin forming a base for the microlenses L0 and providing good flatness. The microlenses L0 are arranged in a so-called "MLA" ("Microlens Array") with one microlens per pixel.

The lenses 4 of the optical set are generally formed in molds by using a polymer resin that is removed from the molds after baking. Another known technique of manufacturing the lenses 4 involves printing polymer resin on a base, then the resin hot creeping to obtain a convex (rounded) face.

The microlenses L0 are also manufactured by using a polymer resin and the method for manufacturing the latter comprises for example depositing a layer of light-sensitive polymer resin (photoresist) onto an imager plate, soft baking, exposing the layer of resin to an ultraviolet light through an insolation mask and removing the insolated parts with an organic solvent to obtain an array of flat pads. The flat lenses are then subjected to a determined temperature to undergo a thermal creep that renders their upper face convex. They are then hardened by a final operation of annealing.

These manufacturing methods and particularly the method for manufacturing and mounting the objective lenses in the optical set, have the disadvantage of being complex, long to implement, and of involving many parts. As a result, these methods are costly.

BRIEF SUMMARY OF THE INVENTION

One embodiment of the present invention provides a method for manufacturing and mounting lenses onto an imager that is an alternative to the known methods. In particular, an embodiment of the present invention enables modules for capturing images having a simplified structure to be manufactured collectively.

Thus, one embodiment of the present invention collectively produces the lenses in a plate of a transparent material and fixes the plate integrating the lenses directly onto a plate of a semiconductor material (wafer) on which imagers have been collectively produced, then to cut the two plates fixed onto each other into chips to individualize the imagers associated with the lenses, and thus collectively manufacture modules for capturing images or for capturing video.

An embodiment the present invention provides a method for manufacturing a micro-module for capturing images comprising an imager and at least one lens, the method comprising manufacturing at least one imager on a first plate of a semiconductor material.

According to one embodiment of the present invention, the method comprises:
producing at least one optical zone to form a lens in at least one second plate of a transparent material, and
assembling the first and second plates so that the imager can receive light through the optical zone.

According to one embodiment of the present invention, the method comprises producing in the second plate at least one diffraction grating forming an infrared filter, so as to filter the light arriving on the imager through the optical zone.

According to one embodiment of the present invention, the method comprises producing in the second plate at least one diaphragm, so that the light arriving on the imager through the optical zone passes through the diaphragm.

According to one embodiment of the present invention, the diffraction grating and/or the diaphragm is produced using a laser beam focused to a depth in the second plate, the laser beam having sufficient energy to render material constituting the second plate opaque.

According to one embodiment of the present invention, the first and second plates are assembled using a layer of transparent glue, a thickness of which is sufficient to prevent the second plate from being directly in contact with microlenses of the imager.

According to one embodiment of the present invention, the method further comprises producing at least one optical zone to form a lens in a third plate of a transparent material, and assembling the second and third plates, so that each optical zone of the third plate forms a lens with an optical zone of the second plate.

According to one embodiment of the present invention, the optical zones of the second and third plates form cavities in the plates, the second and third plates being assembled so that each optical zone of the second plate forms a closed volume of lenticular shape with an optical zone of the third plate.

According to one embodiment of the present invention, the closed volume is filled with a transparent material having a refractive index chosen according to optical properties of the lens to be produced.

According to one embodiment of the present invention, the method further comprises producing in the third plate at least one diffraction grating forming an infrared filter, so as to filter the light arriving on the imager through the optical zone formed in the third plate.

According to one embodiment of the present invention, the method further comprises producing in the third plate at least one diaphragm, so that the light arriving on the imager through the optical zone passes through the diaphragm.

According to one embodiment of the present invention, the diffraction grating and/or the diaphragm is produced using a laser beam focused to a depth in the third plate, the laser beam having sufficient energy to render material constituting the third plate opaque.

According to one embodiment of the present invention, each of said at least one optical zone comprises a lenticular cavity formed in the second plate, the method comprising forming a lens of a transparent material in the lenticular cavity.

According to one embodiment of the present invention, each optical zone comprises a first rounded zone forming a lens on a face of the plate opposite the imager, and spacing the rounded zone from the imager.

According to one embodiment of the present invention, each optical zone comprises on a face opposite a face comprising the first rounded zone a second rounded zone centered on the first rounded zone.

According to one embodiment of the present invention, the first rounded zone is formed at a bottom of a cavity that is filled with a transparent material.

An embodiment of the present invention also relates to the application of the method as defined above to collective manufacturing of micro-modules for capturing images, comprising:
  collectively producing a plurality of imagers on the first plate,
  collectively producing a plurality of optical zones forming lenses on the second plate, and
  cutting the plates after assembly thereof to obtain individual micro-modules.

An embodiment of the present invention also relates to the application of the method as defined above to collective manufacturing of micro-modules for capturing images, comprising:
  collectively producing a plurality of imagers on the first plate,
  cutting the first plate to obtain individual imagers,
  collectively producing a plurality of optical zones forming lenses on the second plate,
  assembling imagers on the second plate so that the imager can receive light through an optical zone, and
  cutting the second plate after assembly thereof with the imagers to obtain individual micro-modules.

An embodiment of the present invention also relates to the application of the method as defined above to collective manufacturing of micro-modules for capturing images, comprising:
  collectively producing a plurality of imagers on the first plate,
  collectively producing a plurality of optical zones forming lenses on the second plate,
  cutting the plate to obtain individual lenses,
  assembling lenses on the first plate so that the imagers can receive light through a lens, and
  cutting the first plate after assembly thereof with the lenses to obtain individual micro-modules.

An embodiment of the present invention also relates to a module for capturing images comprising an imager and at least one lens, the imager being produced on a first plate of a semiconductor material.

According to one embodiment of the present invention, the lens comprises an optical zone produced in at least one second plate of a transparent material, and the first and second plates are assembled so that the imager can receive light through the optical zone.

According to one embodiment of the present invention, the module further comprises a diffraction grating forming an infrared filter produced in the second plate so as to filter the light arriving on the imager through the optical zone.

According to one embodiment of the present invention, the module further comprises a diaphragm produced in the second plate so that the light arriving on the imager through the optical zone passes through the diaphragm.

According to one embodiment of the present invention, the diaphragm is produced using a laser beam focused to a depth in the second plate, the laser beam having sufficient energy to render material constituting the second plate opaque.

According to one embodiment of the present invention, the first and second plates are assembled by using a layer of transparent glue, a thickness of which is sufficient to prevent the second plate from being directly in contact with microlenses of the imager.

According to one embodiment of the present invention, the lens comprises an optical zone produced in a third plate of a transparent material, the first and second plates being assembled with each other.

According to one embodiment of the present invention, the optical zones of the second and third plates form cavities in the plates, the second and third plates being assembled so that each optical zone of the second plate forms a closed volume of lenticular shape with an optical zone of the third plate.

According to one embodiment of the present invention, the closed volume is filled with a transparent material having a refractive index chosen according to optical properties of the lens to be produced.

According to one embodiment of the present invention, the third plate comprises a diffraction grating forming an infrared filter, to filter the light arriving on the imager through the optical zone formed in the third plate.

According to one embodiment of the present invention, the third plate comprises a diaphragm, so that the light arriving on the imager through the optical zone passes through the diaphragm.

According to one embodiment of the present invention, the diffraction grating and/or the diaphragm is produced using a laser beam focused to a depth in the third plate, the laser beam having sufficient energy to render material constituting the third plate opaque.

According to one embodiment of the present invention, the optical zone comprises a lenticular cavity formed in the second plate and a lens of a transparent material formed in the lenticular cavity.

According to one embodiment of the present invention, the optical zone comprises a first rounded zone forming a lens on a face of the plate opposite the imager and means for spacing the rounded zone from the imager.

According to one embodiment of the present invention, each optical zone comprises on a face opposite a face comprising the first rounded zone a second rounded zone centered on the first rounded zone.

According to one embodiment of the present invention, the first rounded zone is formed at a bottom of a cavity that is filled with a transparent material.

BRIEF DESCRIPTION OF THE SEVERAL VIEWS OF THE DRAWINGS

These and other features shall be presented in greater detail in the following description of one or more embodiments of the present invention, given in relation with, but not limited to the following figures, in which.

DETAILED DESCRIPTION

In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

An embodiment of the present invention is in line with efforts to improve imager technology by reducing the cost prices while still providing quality.

Figure 1:
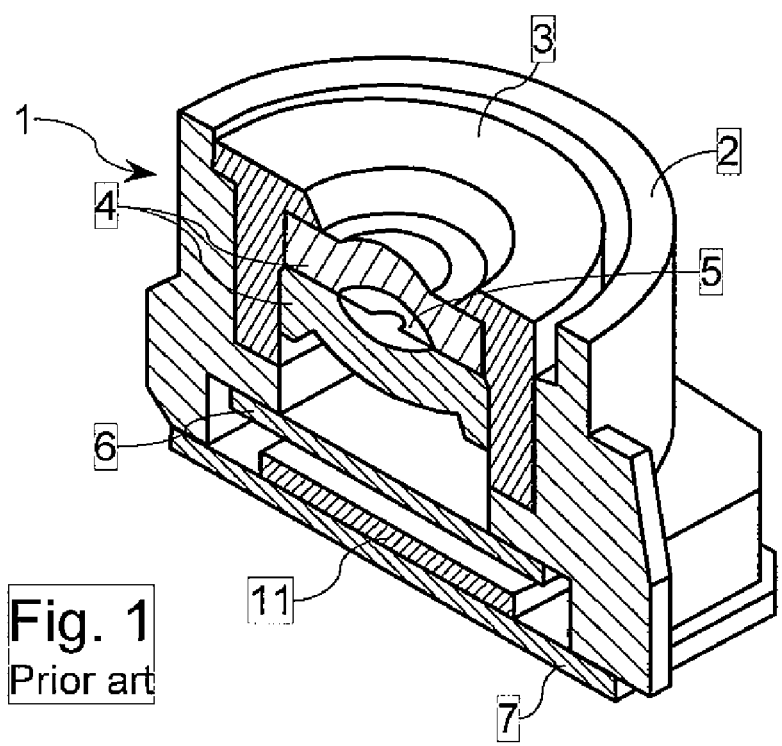
FIG. 1 described above represents a CMOS imager block according to prior art.
Figure 2:
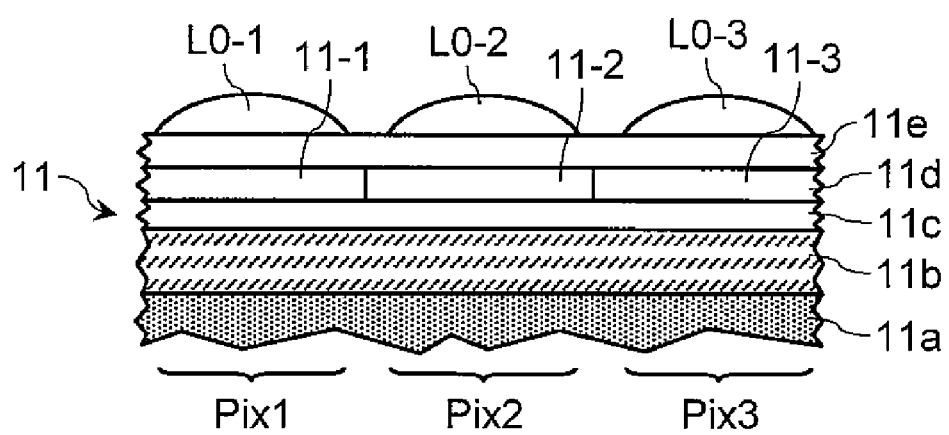
FIG. 2 described above is a cross-section of a CMOS imager chip.
Figure 3:
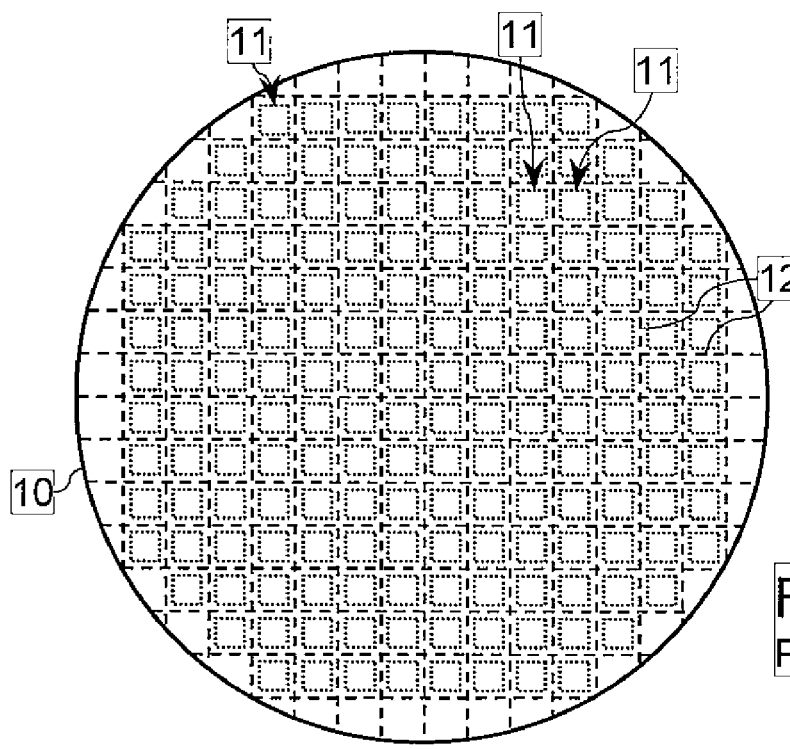
FIG. 3 is a top view of a semiconductor wafer on which imagers have been produced collectively.
Figure 4:
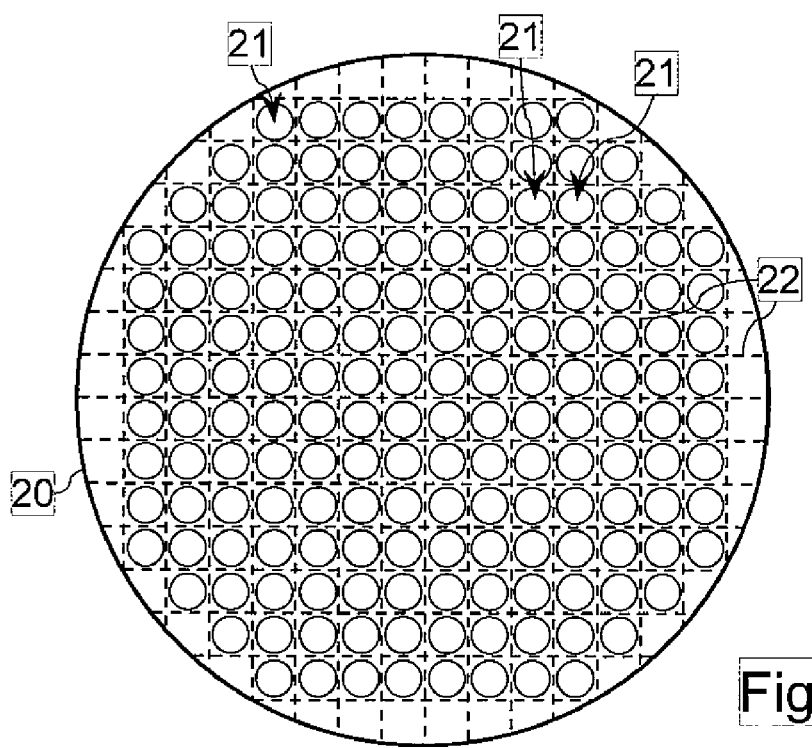
FIG. 4 is a top view of a plate in which lenses have been produced collectively.
Figure 5:
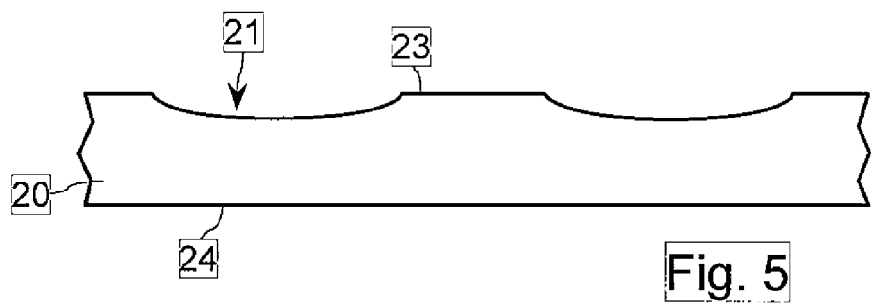
FIG. 5 is a partial cross-section of the lens plate represented in FIG. 4.
Figure 6:
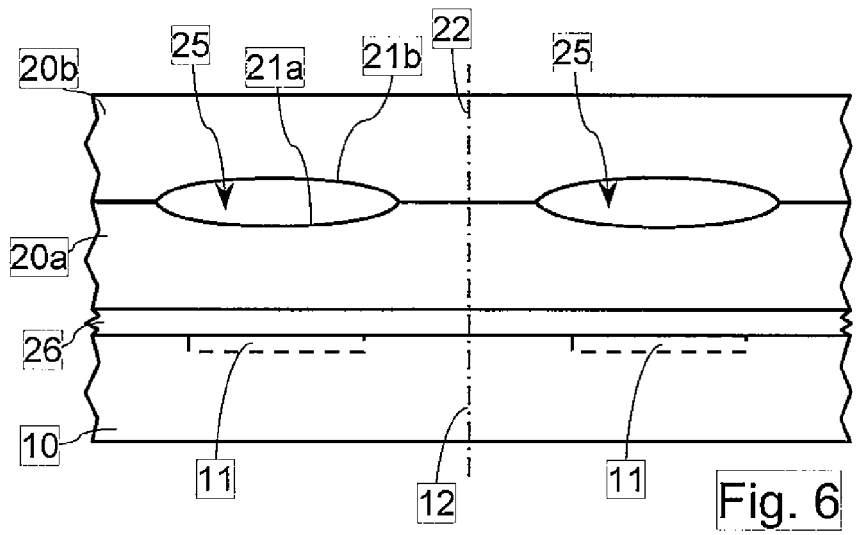
FIG. 6 is a partial cross-section of a wafer of imagers on which lens plates have been assembled, according to a first embodiment of the present invention.

According to one embodiment of the present invention, the manufacturing of modules for capturing images or capturing video comprises the following:

collectively producing CMOS imagers on a first silicon plate 10 (wafer), shown in FIGS. 2 and 3, collectively producing lenses on a second plate of a transparent material 20, shown in FIGS. 4 to 7, assembling plates 10, 20, shown in FIG. 6, and cutting the plates 10, 20 after assembly (not represented), enabling individual pre-assembled micro-modules to be obtained each comprising a CMOS imager 11 and a lens.

FIG. 3 is a view of the front face of a classic semiconductor wafer 10, generally of silicon, comprising a plurality of active regions 11 each forming an imager such as the one represented in FIG. 2. The active regions 11 have been produced collectively on the wafer using the techniques of microelectronics, in particular by implantation of dopants, deposit and/or growth of oxide and deposit and/or growth of various materials (e.g., metal, polysilicon, dielectric material, passivation material, colored resins, polymer resin, etc.).

After producing the active regions 11, the wafer must normally be cut into chips each comprising one of these active regions. This operation of cutting the wafer into "dice", called singulation, is generally performed with a diamond slitting wheel, by following scribe lines 12 represented in dotted lines in FIG. 3 and forming a grid on the surface of the wafer.

According to one embodiment of the present invention, the lenses are also produced collectively on a plate represented in a front or back view in FIG. 4. The plate 20 represented in FIG. 4 comprises optical zones 21 of circular shape, each forming a lens or a portion of lens. The optical zones 21 are arranged on the plate in the form of an array (in lines and in columns) with spacing substantially identical to that of the CMOS imagers 11 on the wafer 10 represented in FIG. 3. Thus, it is possible to center each optical zone 21 on an imager 11, when the plate 20 is disposed on the wafer 10.

FIG. 5 represents in a partial cross-section a plate 20 according to a first embodiment of the present invention. In FIG. 5, the plate 20 comprises a flat face 24 and an opposite face 25 comprising optical zones 21 of concave shape, for example spherical.

The plate 20 is for example formed in a mold by using a transparent polymer resin that is removed from the mold after baking.

FIG. 6 represents a first embodiment of lenses according to the present invention. In FIG. 6, the lenses are produced using two plates 20a, 20b, such as the one represented in FIGS. 4 and 5. The two plates 20a, 20b are assembled against each other, each optical zone 21a of the plate 20a is disposed opposite an optical zone 21b of the plate 20b, so as to delimit together a cavity of lenticular shape 25. The two plates 20a, 20b are fixed to each other by an appropriate technique, such as a transparent glue.

The radius of curvature of each optical zone 21a is identical to or different from that of the optical zones 21b. The radiuses of curvature of the zones 21a, 21b are chosen according to the optical properties desired for the lenses to be produced.

Each of the two plates 20a, 20b has a refractive index also chosen according to the optical properties desired for the lenses to be produced.

Prior to fixing the plates 20a, 20b, the cavities 25 can be filled with a transparent material having a refractive index chosen according to the optical properties desired for the lenses to be produced.

Once assembled, the plates 20a, 20b are fixed onto the wafer 10 using a layer of transparent glue 26. The thickness of the layer of glue is sufficient to prevent the plate 20a from being in contact with the microlenses LO formed on the wafer 10. The layer of glue 26 is for example deposited in liquid form while the wafer 10 is put into rotation around its symmetry axis of rotation, to obtain an evenly spread layer of glue.

Alternatively, the front face of the wafer can first be protected by a layer of a transparent material. In this case, it is not necessary for the layer of glue to be thick.

It shall be noted that the plate 20a can be assembled to the wafer 10 before being assembled to the plate 20b.

In the next step of manufacturing, the assembly of the wafer 10 and of the plates 20a, 20b fixed onto the wafer is cut into chips each comprising one of the active regions 11 of the wafer and a lens 21a, 21b fixed onto the active region 11. This "dicing" operation, referred to as "singulation", can be performed with a diamond slitting wheel, following scribe lines 12, 22 (represented in dotted lines in FIGS. 3 and 4), forming a grid on the surface of the wafer 10 and on the surface of the plates 20a, 20b.

Figure 7:
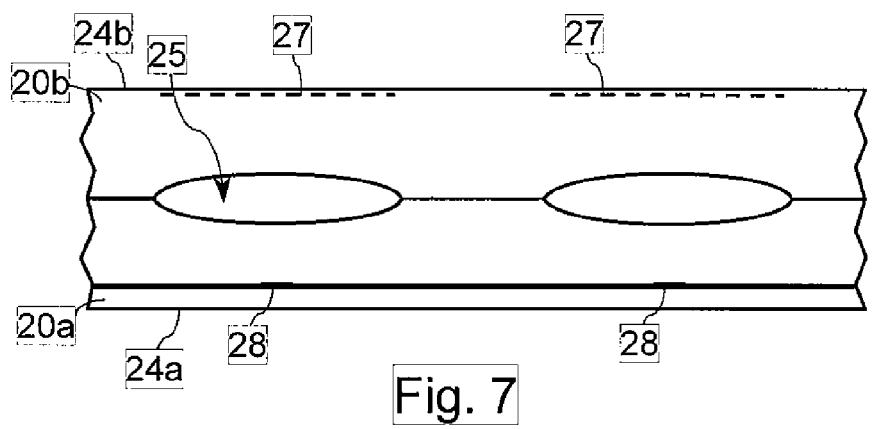
FIG. 7 is a partial cross-section of an assembly of two lens plates, according to a second embodiment of the present invention.

In FIG. 7 representing the plates 20a, 20b assembled, the plate 20a comprises an infrared filter 27 formed on the flat face 24a opposite each zone 21a, 21b. Each infrared filter is produced by a diffraction grating the geometry of which is determined according to the range of wavelengths to be filtered. Each diffraction grating is produced for example by forming arrays of trenches in the mold for manufacturing the plate 20 on the flat face 24. After removal from the mold, the flat face is covered with a layer of an appropriate opaque material that also fills the trenches. The face covered with the opaque material is then polished to reveal the trenches filled with the opaque material and the flat face between the trenches.

The diffraction gratings can also be produced in the mass of the plate 20a or 20b using a laser beam focused through a "wide-angle" lens to a desired depth in the plate. The laser beam used has sufficient energy to locally degrade the material constituting the plate rendering it opaque, but without altering the rest of the material, whether on the surface or in the rest of the volume. For this purpose, the laser beam used is for example a femtosecond laser beam. The pattern of the diffraction grating is produced for example by displacing the plate in its plane.

It shall be noted that the diffraction gratings can be formed indifferently in one and/or the other of the two plates 20a, 20b.

A diaphragm 28 can also be produced in one or other of the two plates 20a, 20b opposite each optical zone 21a, 21b. The diaphragm is produced in one embodiment using the technique described previously involving a laser beam of sufficient energy focused to a certain depth in the plate.

Figure 8:
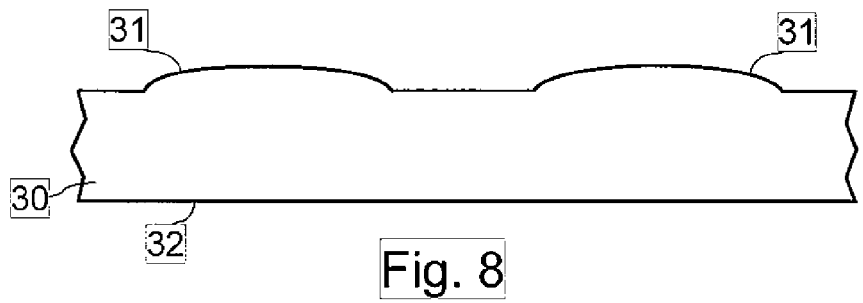
FIG. 8 is a partial cross-section of a lens plate, according to a third embodiment of the present invention.

FIG. 8 represents a third embodiment of lenses according to the present invention. In FIG. 8, the lenses are formed using a plate 30 comprising a flat face 32 and an opposite face comprising rounded zones 31 each forming a lens. The plate 30 can be produced by molding.

Figure 9A:
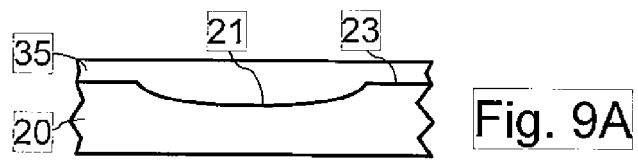
FIGS. 9A to 9D are partial cross-sections of a lens plate according to a fourth embodiment, showing steps of manufacturing the lens plate.
Figure 9B:
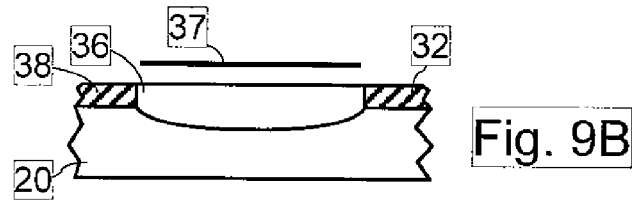
Figure 9C:
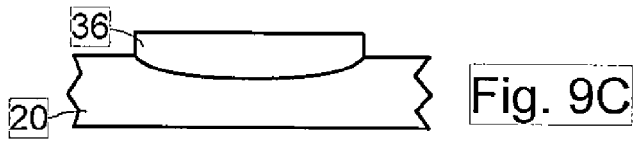
Figure 9D:
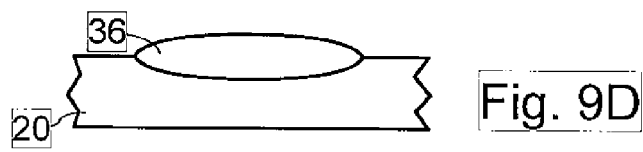

FIGS. 9A to 9D represent a third embodiment of lenses according to the present invention. In FIG. 9D, the lenses are formed using a plate 20 such as the one represented in FIGS. 4 and 5. Lenses 36 are formed in the cavities 21.

The lenses 36 are formed in the manner shown by FIGS. 9A to 9D. In FIG. 9A, the face 23 comprising the cavities 21 of the plate 20 is covered with a layer 35 of light-sensitive transparent polymer resin deposited in liquid form, which undergoes a baking step.

In FIG. 9B, the layer of resin 35 is exposed to an ultraviolet light through an insolation mask 37 protecting the zones of the layer 35 above the zones 21.

In FIG. 9C, the zones 38 that have been exposed to the ultraviolet light are removed, for example using an organic solvent to obtain an array of flat pads 36 formed above the zones 21.

In FIG. 9D, the remaining flat pads 36 of the layer 35 are subjected to a determined temperature to undergo a thermal creep that transforms the flat face of the pads into a convex (rounded) face. They are then hardened by a final operation of annealing.

Figure 10:
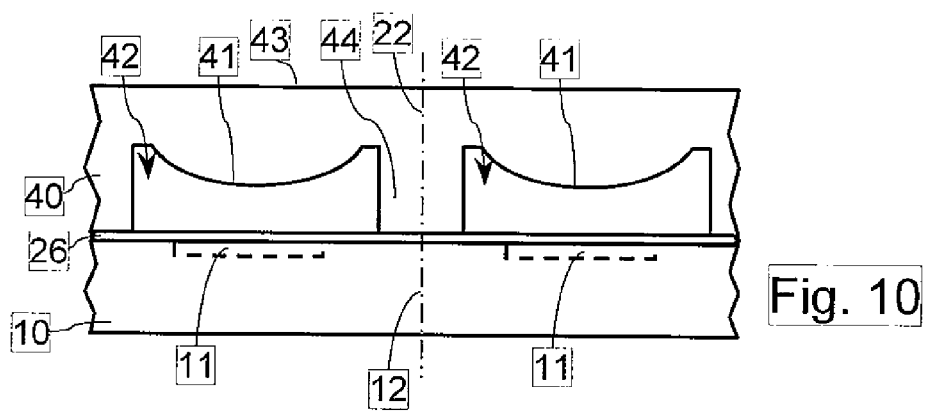
FIG. 10 is a partial cross-section of a lens plate, according to a fifth embodiment of the present invention, assembled on a wafer of imagers.

FIG. 10 represents a third embodiment of lenses according to the present invention. FIG. 10 represents a plate 40 comprising a flat face 43 and an opposite face comprising cavities 42 of cylindrical or cubic shape, or more generally parallelepipedal. The cavities 42 have a rounded bottom 41 and are arranged so that their rounded bottom 41 can be centered above an active zone 11 of the wafer.

The rounded bottoms 41 are for example of spherical shape the radius of curvature of which is chosen according to the optical properties desired for the lenses.

The plate 40 is manufactured in one embodiment by molding a transparent polymer resin.

The cavities 42 are either left empty or partially or totally filled with a transparent polymer resin having a refractive index chosen according to the optical properties desired for the lenses to be produced.

As described above with reference to FIG. 7, diffraction gratings producing infrared filters or diaphragms can be formed on the flat faces or in the plate.

In an alternative embodiment, the plate 40 does not comprise any cavities, but merely rounded zones 41 and spacers 44 spacing the rounded parts 41 from the front face of the wafer 10.

Figure 11:
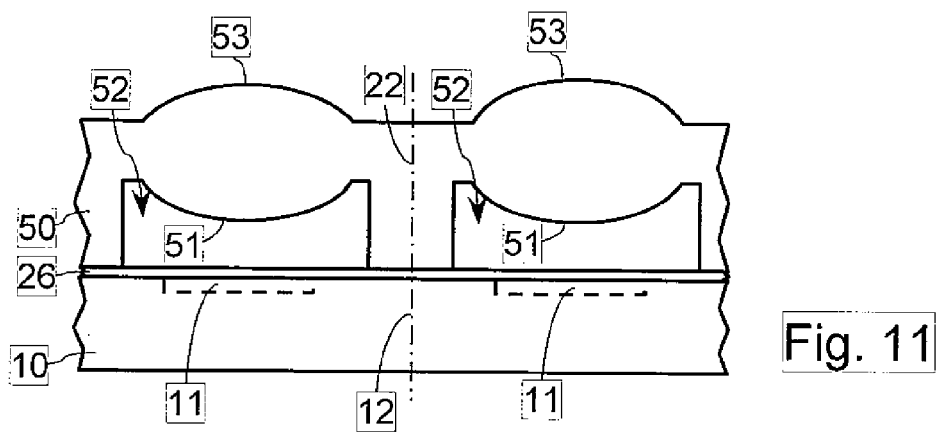
FIG. 11 is a partial cross-section of a lens plate, according to a sixth embodiment of the present invention, assembled on a wafer of imagers.

FIG. 11 represents another alternative of the plate represented in FIG. 10. The plate 50 represented in FIG. 11 has a shape similar to that of the plate 40, the only difference being that it does not comprise any upper flat face 43. Thus, the plate 50 has a face comprising cavities 52 of cylindrical or cubic shape, or more generally parallelepipedal, with a rounded bottom 51. The face 53 opposite the one comprising the cavities 52 also has rounded zones 53 centered on the rounded bottoms 51.

The cavities 42, 52 are either left empty or partially or totally filled with a transparent polymer resin having a refractive index chosen according to the optical properties desired for the lenses to be produced.

In FIGS. 10 and 11, it is not necessary to provide a thick layer of glue 26 to fix the plate 40, 50 onto the wafer 10, as the presence of the cavities 42, 52 avoids any contact between the plate 40, 50 and the microlenses formed on the imager 11.

Thus, the various steps of manufacturing described in the above, particularly of manufacturing the lens plates, of mounting, assembling and cutting, may implement techniques currently used in the microelectronics industry. The module for capturing images is thus obtained collectively using a silicon plate comprising the imagers with their colored filters and their microlenses, and one or more plates of transparent materials, forming the objective lenses, each possibly associated with an infrared or ultraviolet filter and a diaphragm.

One or more embodiments of the present invention thus enables production rates to be achieved that are much higher than those involving a lens-holder block in which the objective lenses and a diaphragm must be mounted, as the lens-holder block must then be mounted separately into a frame with the imager and the infrared filter. Following the phase of cutting out the assembled plates, the modules thus individualized are each constituted of a single part. They can thus be mounted into a frame in a single operation. As the frame must only receive a single part, its structure can be significantly simplified, which further reduces the manufacturing cost.

It will be understood by those skilled in the art that various alternative embodiments of the present invention are possible. In particular, other embodiments of the manufacturing method according to the present invention are possible, particularly concerning the order of implementation of cutting and assembling the plates 10, 20.

Thus, in a second embodiment, the plate 10 is previously cut along its scribe lines 12 to obtain a plurality of chips each comprising an imager. Each CMOS imager is then assembled on the plate 20.

In a third embodiment, the plate 20, 40, 50 or the plates 20a, 20b once assembled are previously cut along their scribe lines 22 to obtain a plurality of chips each comprising one or more objective lenses. Each chip is then assembled on the plate 10.

These embodiments particularly allow for a difference in dimensions between the imagers and the chips forming the objective lenses. If the smallest region is cut before assembling, it can be produced in a greater number on a same plate than the other region. The surface of the two plates can thus be used to the maximum. Thus, the imager can have a larger surface than its optically sensitive surface, so as to integrate more advanced functions for processing image signals.

It will also be understood by those skilled in the art that various other embodiments of the method according to the present invention are possible. The examples of lens plates described above point to many other embodiments of lenses. It is possible for example to assemble more than two transparent plates to obtain a more complex combination of lenses. Thus, it is possible to assemble a plate 20b as represented in FIG. 6 with a plate 50. In FIG. 8, it is possible to form on the plate 20 a thicker layer 30 linking the lenticular shapes 31 between one another. This thicker layer can be produced separately by molding. The upper face of this thicker layer can also receive a plate 20b.

It will also be understood by those skilled in the art that various applications of embodiments of the present invention may be made. Thus, the present invention does not only apply to CMOS imagers, but more generally to any imager constituted of an integrated circuit, such as CCD imagers.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments, including what is described in the Abstract, is not intended to be exhaustive or to limit the invention to the precise forms disclosed. While specific embodiments and examples are described herein for illustrative purposes, various equivalent modifications (such as those described above) are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method for manufacturing a micro-module for capturing images, the method comprising:
   manufacturing an imager on a first plate of a semiconductor material;
   forming an optical zone of a lens from a second plate of a transparent material, the forming including forming a curvature in a surface of the second plate; and
   assembling the first and second plates so that the imager can receive light through the optical zone, wherein:
   manufacturing the imager includes forming a plurality of photosites and a plurality of microlenses on the photosites, respectively; and
   the first and second plates are assembled using a layer of transparent glue, a thickness of which is sufficient to prevent the second plate from being directly in contact with the microlenses of the imager.

2. A method according to claim 1, further comprising producing in the second plate at least one diffraction grating forming an infrared filter configured to filter the light arriving on the imager through the optical zone.

3. A method according to claim 1, further comprising producing in the second plate at least one diaphragm configured to allow the light arriving on the imager through the optical zone to pass through the diaphragm.

4. A method according to claim 3 wherein the diaphragm is produced using a laser beam focused to a depth in the second plate, the laser beam having sufficient energy to render material constituting the second plate opaque.

5. A method according to claim 1 wherein each of said at least one optical zone comprises a first rounded zone forming a lens on a face of the plate opposite the imager, and spacing the rounded zone from the imager.

6. A method according to claim 5 wherein each optical zone comprises on a face opposite a face comprising the first rounded zone a second rounded zone centered on the first rounded zone.

7. A method according to claim 5 wherein the first rounded zone is formed at a bottom of a cavity that is filled with a transparent material.

8. A method for manufacturing a micro-module for capturing images having an imager and a lens, the method comprising:
   manufacturing an imager on a first plate of a semiconductor material;
   producing an optical zone in a second plate of a transparent material;
   producing an optical zone in a third plate of a transparent material, and assembling the second and third plates, so that the optical zone of the third plate forms a lens with the optical zone of the second plate and
   assembling the first and second plates so that the imager can receive light through the optical zones.

9. A method according to claim 8 wherein the optical zones of the second and third plates form cavities in the plates, the second and third plates being assembled so that the optical zone of the second plate forms a closed volume of lenticular shape with the optical zone of the third plate.

10. A method according to claim 9 wherein the closed volume is filled with a transparent material having a refractive index chosen according to optical properties of the lens to be produced.

11. A method according to claim 8, further comprising producing in the third plate a diffraction grating forming an infrared filter configured to filter the light arriving on the imager through the optical zone formed in the third plate.

12. A method according to claim 8, further comprising producing in the third plate a diaphragm configured to allow the light arriving on the imager through the optical zone to pass through the diaphragm.

13. A method according to claim 12 wherein the diaphragm is produced using a laser beam focused to a depth in the third plate, the laser beam having sufficient energy to render material constituting the third plate opaque.

14. A method for manufacturing a micro-module for capturing images, the method comprising:
   manufacturing an imager on a first plate of a semiconductor material;
   forming an optical zone of a lens from a second plate of a transparent material, the forming including forming a curvature in a surface of the second plate; and
   assembling the first and second plates so that the imager can receive light through the optical zone, wherein said optical zone comprises a lenticular cavity formed in the second plate, the method further comprising forming a lens of a transparent material in the lenticular cavity.

15. A method, for collective manufacturing of micro-modules for capturing images, comprising:
   collectively producing a plurality of imagers on a first plate of a semiconductor material;
   collectively producing a plurality of optical zones forming lenses on a second plate of a transparent material, wherein collectively producing the plurality of optical zones includes, for each lens, forming an optical zone of the lens from the second plate, the forming including forming a curvature in a surface of the second plate;

assembling the first and second plates so that the imagers can receive light through the optical zones, and cutting the plates after assembly thereof to obtain individual micro-modules.

16. A method for collective manufacturing of micro-modules for capturing images, comprising:

collectively producing a plurality of imagers on a first plate of a semiconductor material;

cutting the first plate to obtain individual imagers;

collectively producing a plurality of optical zones forming lenses on a second plate of a transparent material, wherein collectively producing the plurality of optical zones includes, for each tens, forming a curvature in a surface of the second plate;

assembling the individual imagers on the second plate so that the individual imagers can receive light through the optical zones, respectively; and cutting the second plate after assembling the individual imagers to obtain individual micro-modules.

17. A method for collective manufacturing of micro-modules for capturing images, comprising:

collectively producing a plurality of imagers on a first plate of a semiconductor material;

collectively producing a plurality of optical zones forming lenses on a second plate of a transparent material, wherein collectively producing the plurality of optical zones includes, for each lens, forming an optical zone of the lens from the second plate, the forming including forming a curvature in a surface of the second plate;

cutting the second plate to obtain individual lenses;

assembling the individual lenses on the first plate so that the imagers can receive light through the individual lenses, respectively; and cutting the first plate after the assembling to obtain individual micro-modules.

18. A method to collectively manufacture micro-modules for capturing images, the method comprising:

collectively producing a plurality of imagers on a first plate;

collectively producing a plurality of optical zones forming lenses on a second plate;

centering a first lens of said lenses with respect to a first imager of said imagers to allow said first imager to receive light that passes through the optical zone of said first lens;

assembling said centered first lens and first imager to provide an individual one of said micro-modules; and cutting said first lens and first imager away from their respective plates, wherein said cutting includes cutting said first imager away from the first plate, wherein said assembling includes assembling said cut first imager to said first lens which is still attached to said second plate, followed by said cutting that includes cutting said first lens having said imager assembled thereto away from said second plate.

19. A method according to claim 18 wherein collectively producing a plurality of zones includes forming a plurality of curvatures in a surface of the second plate.

20. A method to collectively manufacture micro-modules for capturing images, the method comprising:

collectively producing a plurality of imagers on a first plate;

collectively producing a plurality of optical zones forming lenses on a second plate;

centering a first lens of said lenses with respect to a first imager of said imagers to allow said first imager to receive light that passes through the optical zone of said first lens;

assembling said centered first lens and first imager to provide an individual one of said micro-modules; and cutting said first lens and first imager away from their respective plates, wherein said cutting includes cutting said first lens away from the second plate, wherein said assembling includes assembling said cut first lens to said first imager which is still attached to said first plate, followed by said cutting that includes cutting said first imager having said first lens assembled thereto away from said first plate.

21. A method according to claim 20 wherein each optical zone comprises a lenticular cavity formed in the second plate, the method further comprising forming a lens of a transparent material in the lenticular cavity.

22. A method for manufacturing a micro-module for capturing images, the method comprising:

manufacturing an imager on a first plate of a semiconductor material;

producing an optical zone in a second plate of a transparent material, wherein said optical zone comprises a lenticular cavity formed in the second plate;

assembling the first and second plates so that the imager can receive light through the optical zone; and forming a lens of a transparent material in the lenticular cavity.

23. A method according to claim 22, wherein:

manufacturing the imager includes forming a plurality of photosites and a plurality of microlenses on the photosites, respectively; and the first and second plates are assembled using a layer of transparent glue, a thickness of which is sufficient to prevent the second plate from being directly in contact with the microlenses of the imager.

24. A method for collectively manufacturing micro-modules for capturing images, the method comprising:

collectively producing a plurality of imagers on a first plate of a semiconductor material;

collectively producing a plurality of optical zones forming lenses on a second plate of a transparent material;

cutting the second plate to obtain individual lenses;

assembling the individual lenses on the first plate so that the imagers can receive light through the individual lenses, respectively; and cutting the first plate after the assembling to obtain individual micro-modules.

25. A method according to claim 24, wherein:

collectively producing the plurality of imagers includes, for each imager, forming a plurality of photosites and a plurality of microlenses on the photosites, respectively; and the first and second plates are assembled using a layer of transparent glue, a thickness of which is sufficient to prevent the second plate from being directly in contact with the microlenses of the imagers.

* * * * *

UNITED STATES PATENT AND TRADEMARK OFFICE
CERTIFICATE OF CORRECTION

| | | |
|---|---|---|
| PATENT NO. | : 7,964,432 B2 | |
| APPLICATION NO. | : 11/764635 | |
| DATED | : June 21, 2011 | |
| INVENTOR(S) | : Brendan Dunne et al. | |

It is certified that error appears in the above-identified patent and that said Letters Patent is hereby corrected as shown below:

Column 11
Claim 16, Line 13, "zones includes, for each tens, forming a curvature in a" should read as
--zones includes, for each lens, forming a curvature in a--.

Signed and Sealed this

Thirteenth Day of September, 2011

David J. Kappos
*Director of the United States Patent and Trademark Office*